United States Patent [19]

Mizutani et al.

[11] Patent Number: 6,090,531
[45] Date of Patent: Jul. 18, 2000

[54] COMPOSTION FOR ANTI-REFLECTIVE COATING MATERIAL

[75] Inventors: Kazuyoshi Mizutani; Hiroshi Yoshimoto, both of Shizuoka, Japan

[73] Assignee: Fuji Photo Film Co., Ltd., Kanagawa, Japan

[21] Appl. No.: 08/908,522

[22] Filed: Aug. 7, 1997

[30] Foreign Application Priority Data

Aug. 7, 1996 [JP] Japan ................................. 8-208630
Aug. 7, 1996 [JP] Japan ................................. 8-208631

[51] Int. Cl.$^7$ .................. G03F 7/11; G03F 7/38; G03F 7/26
[52] U.S. Cl. .................. 430/325; 430/271.1; 430/326; 430/330; 526/288; 525/375; 525/374; 525/328.6; 525/154
[58] Field of Search .................. 526/288; 525/375, 525/374, 328.6, 154; 430/271.1, 325, 326, 330

[56] References Cited

U.S. PATENT DOCUMENTS

| | | | |
|---|---|---|---|
| 4,702,992 | 10/1987 | Ishii et al. | 430/272.1 |
| 4,910,122 | 3/1990 | Arnold et al. | 430/327 |
| 5,294,680 | 3/1994 | Knors et al. | 525/327.4 |
| 5,525,457 | 6/1996 | Nemoto et al. | |
| 5,733,714 | 3/1998 | McCulloch et al. | 430/271.1 X |
| 5,886,102 | 3/1999 | Sinta et al. | 430/271.1 X |

FOREIGN PATENT DOCUMENTS

| | | | |
|---|---|---|---|
| 0535490 | 4/1993 | European Pat. Off. | |
| 6118656 | 4/1994 | Japan | 430/271.1 |

OTHER PUBLICATIONS

Nemoto et al, English Translation of Japanese Document No. 6–118656, A, Published Apr. 28, 1994, Translation No. PTO 98–1445, United States Patent and Trademark Office, Washington DC, Translated by Diplomatic Language Services, Inc, Feb. 1998, 32 pages.

*Primary Examiner*—Cynthia Hamilton
*Attorney, Agent, or Firm*—Sughrue, Mion, Zinn, Macpeak & Seas, PLLC

[57] ABSTRACT

A composition for anti-reflective coating material is disclosed, comprising a polymer compound having repeating units having specific structure, and optionally a melamine, guanamine, urea, phenol, naphthol or hydroxyanthracene compound substituted by at least one group selected from the group consisting of a methylol group and an alkoxymethyl group at two or more positions. The composition for anti-reflective coating material of the present invention is effective for the reduction of adverse effects of reflection by the substrate in a lithographic process using various radiations. A resist pattern formation process which comprises the use of the composition for anti-reflective coating material is also disclosed.

3 Claims, No Drawings

COMPOSITION FOR ANTI-REFLECTIVE COATING MATERIAL

FIELD OF THE INVENTION

The present invention relates to a composition for anti-reflective coating material effective for the reduction of adverse effects of reflection by the substrate in a lithographic process using various radiations and a resist pattern formation process which comprises the use of the composition for anti-reflective coating material.

BACKGROUND OF THE INVENTION

A photoresist is applied to a substrate such as semiconductor wafer, glass, ceramic and metal to a thickness of from 0.5 to 2 μm by a spin coating method or roller coating method. Thereafter, the coated material is heated, dried, exposed to radiation such as ultraviolet rays through an exposure mask to print a circuit pattern thereon, optionally followed by baking, and then developed to form an image thereon.

The coated mask is then etched with this image as a mask to effect a patternwise work on the substrate. Typical examples of fields to this technique is applied include process for the production of semiconductors such as IC and circuit boards for liquid crystal, thermal head, etc., and photofabrication process.

In the fine working of semiconductors using a photoresist, the prevention of reflection of light by the substrate has become more important as the dimensional fineness has developed. Heretofore, to this end, photoresists comprising a light absorber incorporated therein have been used. However, this approach is disadvantageous in that the resolving power is impaired. Therefore, the provision of a bottom anti-reflective coating (BARC) between the photoresist and the substrate has been widely studied.

As the anti-reflective coatings there have been known inorganic coatings made of titanium, titanium dioxide, titanium nitride, chromium oxide, carbon, α-silicone, etc. and organic coatings made of light absorber and polymer. The formation of the former coatings requires apparatus such as vacuum metallizer, CVD apparatus and sputtering apparatus while that of the latter coatings advantageously requires no special apparatus. Thus, the latter coatings have been widely studied.

Examples of the organic anti-reflective coatings include those comprising a condensate of diphenylamine derivative and formaldehyde-modified melamine resin, an alkali-soluble resin and a light absorber as described in JP-B-7-69611 (The term "JP-B" as used herein means an "examined Japanese patent publication"), those comprising a reaction product of maleic anhydride copolymer with diamine type light absorber as described in U.S. Pat. No. 5,294,680, those comprising a resin binder and a methylol melamine heat crosslinking agent as described in JP-A-6-118631 (The term "JP-A" as used herein means an "unexamined published Japanese patent application"), acrylic resin type anti-reflective coatings having a carboxylic acid group, an epoxy group and a light-absorbing group in the same molecule as described in JP-A-6-118656, and those comprising methylol melamine and a benzophenone light absorber as described in JP-A-8-87115.

The physical properties required for these organic anti-reflective coating materials are high absorbance with respect to radiation, insolubility in the resist solvent (no intermixing with the resist layer), higher dry etching rate than resist, etc. as described in *Proc. SPIE,* Vol. 2195, 225–229 (1994).

However, the compounds described in the above cited patents don't meet all of these requirements. Thus, improvements have been desired in this respect. For example, the prior art anti-reflective coatings leave something to be desired in the light absorbing capacity of binder and thus have needed a further light absorber to be incorporated therein. Further, the prevention of intermixing with the resist layer requires the introduction of heat crosslinking effect into the anti-reflective coating. Thus, the crosslinking effect has been introduced into the anti-reflective coating independently of the light absorbing group. Thus, this approach is disadvantageous in that if the crosslinkability of the anti-reflective coating is raised, the absorbance of the anti-reflective coating is reduced. Further, the anti-reflective coating comprising a functional group for enhancing alkali permeability such as carboxylic acid group as a crosslinking system are disadvantageous in that when developed with an aqueous solution of alkali, it is liable to swelling, impairing the shape of the resist pattern.

SUMMARY OF THE INVENTION

It is therefore an object of the present invention to provide a composition for anti-reflective coating material which exerts a high anti-reflective effect, undergoes no intermixing with the resist layer, provides an excellent resist pattern and shows a higher dry etching rate than resist and a resist pattern formation process.

The present invention concerns the following embodiments (1) to (10):

(1) A composition for anti-reflective coating material, comprising a polymer compound A having repeating units represented by the following general formulae (I) and (II):

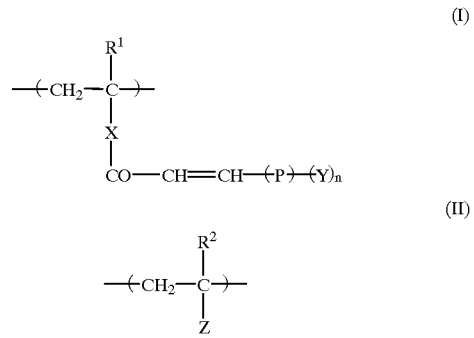

wherein $R^1$ and $R^2$ may be the same or different and each represent a hydrogen atom, a methyl group, a chlorine atom, a bromine atom or a cyano group; X represents a single bond or a divalent organic connecting group; P represents a $C_{6-14}$ aromatic ring having a valence of (n+1); Y represents an electron donative group; Z represents an organic functional group terminated by —$CH_2OR^3$ (in which $R^3$ represents a hydrogen atom or a $C_{1-20}$ hydrocarbon group); and n represents an integer of from 0 to 3, with the proviso that when n is 2 or 3, the plurality of Y's may be the same or different;

(2) The composition for anti-reflective coating material as defined in (1) above, wherein in the general formula (I) X represents a single bond or an alkylene group, an arylene group, an aralkylene group, —$CO_2$—A—, —CONH—A—, —O—A—, —CO—A— or —$SO_2$—A— (in which A represents a $C_{6-14}$ aromatic ring which may have a substituent) having at least one connecting group selected from the group consisting of —$CO_2$—, —CONH—, —O—, —CO— and —$SO_2$— included therein; P represents a phenylene group, a naphthylene group or an anthrylene group; and Y represents a hydrogen atom, —OH, —OR$^4$, —N(R$^5$)(R$^6$) or —SR$^4$ (in which R$^4$ represents a C$_{1-20}$ hydrocarbon group, and R$^5$ and R$^6$ may be the same or different and each represent a hydrogen atom or a C$_{1-20}$ hydrocarbon group);

(3) A process for the formation of a resist pattern, which comprises applying a composition for anti-reflective coating material according to (1) or (2) above to a substrate, baking the coated substrate so that the anti-reflective coating is cured, and then patternwise forming a photoresist layer thereon;

(4) A composition for anti-reflective coating material, comprising:

(a) a polymer compound B having repeating units represented by the following general formula (I); and (b) a melamine, guanamine or urea compound substituted by at least one group selected from the group consisting of a methylol group and an alkoxymethyl group at two or more positions:

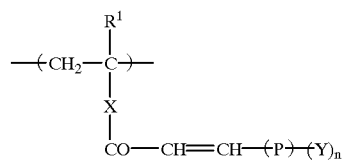

(I)

wherein R$^1$ represents a hydrogen atom, a methyl group, a chlorine atom, a bromine atom or a cyano group; X represents a single bond or a divalent organic connecting group; P represents a C$_{6-14}$ aromatic ring having a valence of (n+1); Y represents an electron donative group; and n represents an integer of from 0 to 3, with the proviso that when n is 2 or 3, the plurality of Y's may be the same or different;

(5) The composition for anti-reflective coating material according to (4) above, wherein in the general formula (I) X represents a single bond or an alkylene group, an arylene group, an aralkylene group, —CO$_2$—A—, —CONH—A—, —O—A—, —CO—A— or —SO$_2$—A— (in which A represents a C$_{6-14}$ aromatic ring which may have a substituent) having at least one connecting group selected from the group consisting of —CO$_2$—, —CONH—, —O—, —CO— and —SO$_2$— included therein; P represents a phenylene group, a naphthylene group, or an anthrylene group; and Y represents a hydrogen atom, —OH, —OR$^4$, —N(R$^5$)(R$^6$) or —SR$^4$ (in which R$^4$ represents a C$_{1-20}$ hydrocarbon group, and R$^5$ and R$^6$ may be the same or different and each represent a hydrogen atom or a C$_{1-20}$ hydrocarbon group);

(6) A composition for anti-reflective coating material, comprising:

(a) a polymer compound B having repeating units represented by the general formula (I); and (c) a phenol compound, naphthol compound or hydroxyanthracene compound substituted by at least one group selected from the group consisting of a methylol group and an alkoxymethyl group at two or more positions:

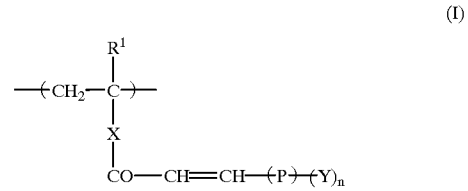

(I)

wherein R$^1$ represents a hydrogen atom, a methyl group, a chlorine atom, a bromine atom or a cyano group; X represents a single bond or a divalent organic connecting group; P represents a C$_{6-14}$ aromatic ring having a valence of (n+1); Y represents an electron donative group; and n represents an integer of from 0 to 3, with the proviso that when n is 2 or 3, the plurality of Y's may be the same or different;

(7) The composition for anti-reflective coating material according to (6) above, wherein in the general formula (I) Y represents —OH, —OR$^4$, —N(R$^5$)(R$^6$) or —SR$^4$ (in which R$^4$ represents a C$_{1-20}$ hydrocarbon group, and R$^5$ and R$^6$ may be the same or different and each represent a hydrogen atom or a C$_{1-20}$ hydrocarbon group);

(8) The composition for anti-reflective coating material according to (6) or (7) above, wherein said phenol compound as the component (c) is a compound represented by the following general formula (III):

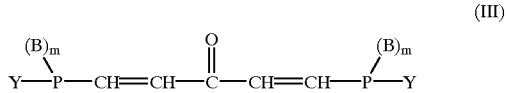

(III)

wherein Y has the same meaning as that in the general formula (I); P represents a C$_{6-14}$ trivalent or tetravalent aromatic ring; the plurality of B's may be the same or different and each represent a methylol group or an alkoxymethyl group; and m represents an integer of 1 and 2;

(9) The composition for anti-reflective coating material according to (8) above, wherein in the general formula (I) Y represents —OH, —OR$^4$, —N(R$^5$)(R$^6$) or —SR$^4$ (in which R$^4$ represents a C$_{1-20}$ hydrocarbon group, and R$^5$ and R$^6$ may be the same or different and each represent a hydrogen atom or a C$_{1-20}$ hydrocarbon group); and

(10) A process for the formation of a resist pattern, which comprises applying a composition for anti-reflective coating material according to any one of (4) to (9) above to a substrate, baking the coated substrate so that the anti-reflective coating is cured, and then patternwise forming a photoresist layer thereon.

DETAILED DESCRIPTION OF THE INVENTION

Then, the polymer compound A having repeating units represented by the foregoing general formulae (I) and (II) will be further described hereinafter.

R$^1$ and R$^2$ each preferably represent a hydrogen atom or a methyl group. X represents a single bond or a divalent organic connecting group. X preferably represents a single bond or an alkylene group, arylene group, aralkylene group, —CO$_2$—A—, —CONH—A—, —O—A—, —CO—A— or —SO$_2$—A— (in which A represents a C$_{6-14}$ aromatic ring which may have a substituent such as benzene ring, naphthalene ring and anthracene ring) having at least one connecting group selected from the group consisting of —CO$_2$—, —CONH—, —O—, —CO— and —SO$_2$— included therein. Examples of the arylene group include phenylene group, naphthylene group, and anthrylene group. Examples of the aralkylene group include —C$_6$H$_4$—CH$_2$—, —C$_{10}$H$_6$—CH$_2$—, and —C$_{14}$H$_8$—CH$_2$—.

P represents a C$_{6-14}$ aromatic ring having a valence of (n+1), preferably an aromatic ring selected from the group consisting of phenylene group, naphthylene group and anthrylene group having a valence of (n+1).

Y represents a hydrogen atom or an electron donative group, preferably a hydrogen atom or a group selected from the group consisting of —OH, —OR$_4$, —N(R$_5$)(R$_6$), and —SR$_4$. R$_4$ represents a C$_{1-20}$ hydrocarbon group, preferably a C$_{1-6}$ straight-chain, branched or cyclic alkyl group, more preferably a methyl group or an ethyl group. R$_5$ and R$_6$ may be the same or different and each represent a hydrogen atom or a C$_{1-20}$ hydrocarbon group, preferably a C$_{1-6}$ straight-chain, branched or cyclic alkyl group, more preferably a methyl group or an ethyl group. In particular, Y preferably represents a hydrogen atom, —OH, —OCH$_3$ or —OCH$_2$CH$_3$.

Z represents an organic functional group terminated by —CH$_2$OR$^3$ group. R$^3$ preferably represents a hydrogen atom or a C$_{1-20}$ alkyl or acyl group. The alkyl group represented by R$^3$ is preferably a C$_{1-6}$ alkyl group, more preferably a methyl group or an ethyl group. The acyl group represented by R$^3$ is preferably an acetyl group.

Preferred examples of Z as an organic functional group terminated by —CH$_2$OR$^3$ group include N-methyloamide group, N-alkoxymethylamide group, group obtained by the reaction of diacetonamide with formaldehyde, group obtained by the alkoxylation of methylol group in these groups, and 4-hydroxy-3,5-bis(hydroxymethyl) phenyl group or 4-hydroxy-3,5-bis(alkoxymethyl)phenyl group having a divalent connecting group such as —CO$_2$— and —CONH— included therein. Preferred examples of the alkoxy group include a methoxy group and an ethoxy group.

Next, the polymer compound B having repeating units represented by the general formula (I) (as compound (a)) will be further described hereinafter.

Y is preferably a hydrogen atom, —OH, —OR$^4$, —N(R$^5$)(R$^6$) or —S(R$^4$). R$^4$ represents a C$_{1-20}$ hydrocarbon group, preferably a C$_{1-6}$ straight-chain, branched or cyclic alkyl group, more preferably methyl or ethyl. R$^5$ and R$^6$ may be the same or different and each represent a hydrogen atom or a C$_{1-20}$ hydrocarbon group, preferably C$_{1-6}$ straight-chain, branched or cyclic alkyl group, more preferably methyl or ethyl. More preferably, the electron donative group represented by Y is a hydrogen atom, —OH, —OCH$_3$ or —OCH$_2$CH$_3$.

R$^1$ is preferably a hydrogen atom or methyl group.

The divalent organic connecting group represented by X is preferably a single bond or an alkylene group, arylene group, aralkylene group, —CO$_2$—A—, —CONH—A—, —O—A—, —CO—A— or —SO$_2$—A— which may comprise a connecting group such as —CO$_2$—, —CONH—, —O—, —CO— and —SO$_2$— included therein. Examples of the arylene group include phenylene group, naphthylene group, and anthrylene group. Examples of the aralkylene group include —C$_6$H$_4$—CH$_2$—, —C$_{10}$H$_6$—CH$_2$—, and —C$_{14}$H$_8$—CH$_2$—. The group A represents a C$_{6-14}$ aromatic ring (e.g., benzene ring, naphthalene ring, anthracene ring).

The aromatic ring represented by P is preferably a phenylene, naphthylene or anthrylene group having a valence of (n+1).

The polymer compound A or B of the present invention may be copolymerized with non-crosslinking monomers. In this manner, the dry etching rate, reflectance, etc. can be finely adjusted.

Examples of such copolymerizable monomers will be listed below. For example, compounds having one addition-polymerizable unsaturated bond selected from the group consisting of acrylic acid esters, acrylamides, methacrylic acid esters, methacrylamides, allyl compounds, vinyl ethers, vinyl esters, styrenes and crotonic esters may be used. Specific examples of these compounds include acrylic acid esters such as alkyl (the number of carbon atoms contained in the alkyl group is from 1 to 10) acrylate (e.g., methyl acrylate, ethyl acrylate, propyl acrylate, t-butyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofufuryl acrylate) and aryl acrylate (e.g., phenyl acrylate, hydroxyphenyl acrylate), methacrylic acid esters such as alkyl (the number of carbon atoms contained in the alkyl group is from 1 to 10) methacrylate (e.g., methyl methacrylate, ethyl methacrylate, propyl methacrylate, isopropyl methacrylate, t-butyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, tetrahydrofurfuryl methacrylate) and aryl methacrylate (e.g., phenyl methacrylate, hydroxyphenyl methacrylate, cresyl methacrylate, naphthyl methacrylate), acrylamides such as acrylamide, N-alkyl acrylamide (Examples of the alkyl group include C$_{1-10}$ alkyl groups such as methyl, ethyl, propyl, butyl, t-butyl, heptyl, octyl, cyclohexyl, benzyl, hyroxyethyl and benzyl), N-aryl acrylamide (Examples of the aryl group include phenyl group, tollyl group, nitrophenyl group, naphthyl group, cyanophenyl group, hydroxyphenyl group, and carboxyphenyl group), N,N-dialkyl acylamide (Examples of the alkyl group include C$_{1-10}$ alkyl group such as methyl, ethyl, butyl, isobutyl, ethylhexyl and cyclohexyl), N,N-aryl acrylamide (Examples of the aryl group include phenyl group), N-methyl-N-phenylacrylamide, N-hydroxyethyl-N-methyl acrylamide and N-2-acetamideethyl-N-acetyl acrylamide, methacrylamides such as methacrylamide, N-alkyl methacrylamide (Examples of the alkyl group include C$_{1-10}$ alkyl groups such as methyl, ethyl, t-butyl, ethylhexyl, hydroxyethyl and cyclohexyl), N-aryl methacrylamide (Examples of the aryl group include phenyl group, hydroxyphenyl group, and carboxyphenyl group), N,N-dialkyl methacrylamide (Examples of the alkyl group include ethyl group, propyl group, and butyl group), N,N-diaryl methacrylamide (Examples of the aryl group include phenyl group), N-hydroxyethyl-N-methyl methacrylamide, N-methyl-N-phenyl methacrylamide and N-ethyl-N-phenyl methacrylamide, allyl compounds such as allyl esters (e.g., allyl acetate, allyl caproate, allyl caprate, allyl laurate, allyl palmitate, allyl stearate, allyl benzoate, allyl acetoacetate, allyl lactate) and allyloxy ethanol, vinyl ethers such as alkylvinyl ether (e.g., hexylvinyl ether, octylvinyl ether, decylvinyl ether, ethylhexylvinyl ether, methoxyethylvinyl ether, ethoxyethylvinyl ether, chloroethylvinyl ether, 1-methyl-2,2-dimethylpropylvinyl ether, 2-ethylbutylvinyl ether, hydroxyethylvinyl ether, diethylene glycol vinyl ether, dimethylamino ethyl vinyl ether, diethylamino ethyl vinyl ether, butylamino ethyl vinyl ether, benzylvinyl ether, tetrahydrofurfurylvinyl ether) and vinylaryl ether (e.g., vinylphenyl ether, vinyltollyl ether, vinylchlorophenyl ether, vinyl-2,4-dichlorophenyl ether, vinylnaphthyl ether, vinylanthranyl ether), vinyl esters such as vinyl butyrate, vinyl isobutyrate, vinyl trimethyl acetate, vinyl diethyl acetate, vinyl valate, vinyl caproate, vinyl chloroacetate, vinyl dichloroacetate, vinyl methoxyacetate, vinyl butoxyacetate, vinyl phenyl acetate, vinyl acetoacetate, vinyl lactate, vinyl-β-phenyl butyrate, vinyl cyclohexyl carboxylate, vinyl benzoate, vinyl salicylate, vinyl chloroacetate, vinyl tetrachlorobenzoate and vinyl naphthoate, styrenes such as styrene, alkylstyrene (e.g., methyl styrene, dimethyl styrene, trimethylene styrene, ethyl styrene, diethyl styrene, isopropyl styrene, butyl styrene, hexyl styrene, cyclohexyl styrene, decyl styrene, benzyl styrene, chloromethyl styrene, trifluoromethyl styrene, ethoxymethyl styrene, acetoxymethyl styrene), alkoxy styrene (e.g., methoxy styrene, 4-methoxy-3-methyl styrene, dimethoxy styrene), halogen styrene (e.g., chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene), hydroxystyrene (e.g., 4-hydroxystyrene, 3-hydroxystyrene, 2-hydroxystyrene, 4-hydroxy-3-methylstyrene, 4-hydroxy-3,5-dimethylstyrene, 4-hydroxy-3-methoxystyrene, 4-hydroxy-3-(2-hydroxybenzyl) styrene) and carboxystyrene, crotonic acid esters such as alkyl crotonate (e.g., butyl crotonate, hexyl crotonate, glycerin monocrotonate), itaconic acid dialkyls (e.g., dimethyl itaconate, diethyl itaconate, dibutyl itaconate), maleic acid or fumaric acid dialkyl esters (e.g., dimethyl malate, dibutyl fumarate) or monoalkyl esters, acrylic acid, methacrylic acid, crotonic acid, itaconic acid, maleic anhydride, maleimide, acrylonitrile, methacrylonitrile, and maleilonitrile. Other examples of the copolymerizable monomers include addition-polymerizable unsaturated compounds copolymerizable with compounds having the repeating units represented by the general formulae (I) and (II) or compounds having the repeating units represented by the general formula (I).

The content of the repeating units represented by the general formulae (I) and (II) to be incorporated in the polymer compound A of the present invention are from 10 to 99% by weight and from 1 to 80% by weight, preferably from 30 to 97% by weight and from 3 to 50% by weight, more preferably from 50 to 95% by weight and from 5 to 30% by weight, respectively.

The content of other copolymerizable components to be incorporated in the polymer compound A of the present invention is from 10 to 90% by weight, preferably from 20 to 80% by weight, more preferably from 25 to 75% by weight.

On the other hand, the ratio of the content of the repeating units of the general formula (I) to that of the other copolymerizable components in the polymer compound B is preferably from 1:9 to 9:1, more preferably from 2:8 to 8:2, particularly from 2.5:7.5 to 7.5:2.5.

Specific examples of the polymer compound A having repeating units represented by the general formulae (I) and (II) and the polymer compound B having repeating units represented by the general formula (I) will be listed below, but the present invention is not limited thereto.

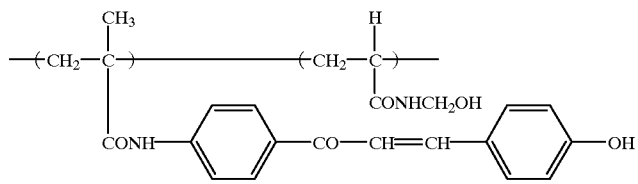

A-1

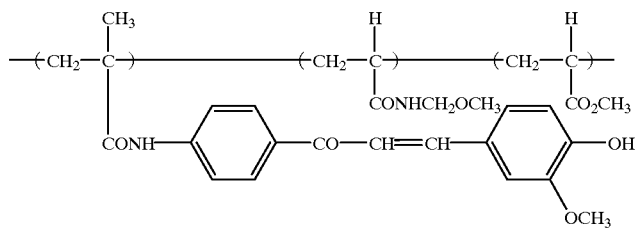

A-2

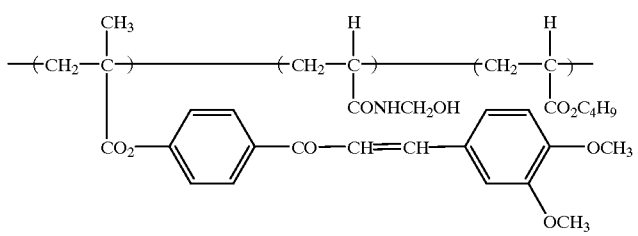

A-3

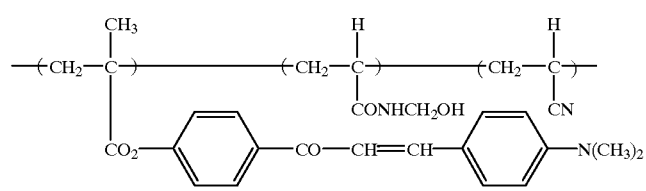
A-4
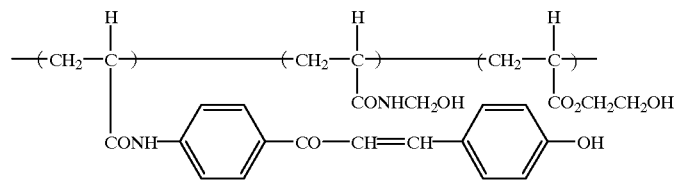
A-5
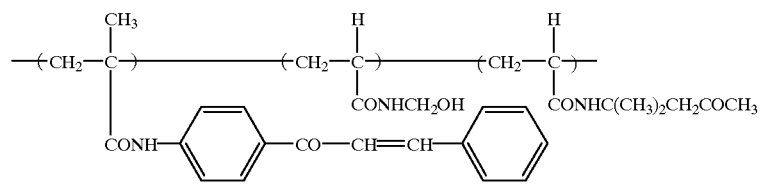
A-6
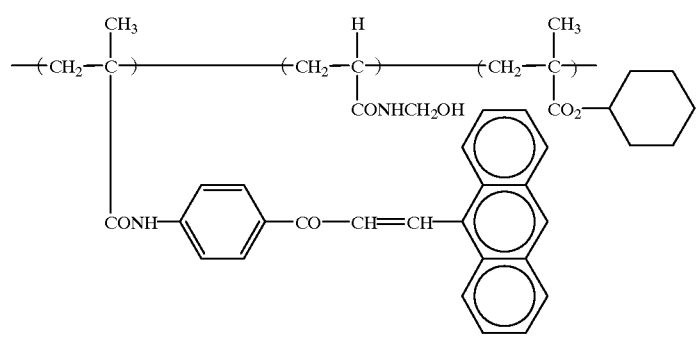
A-7
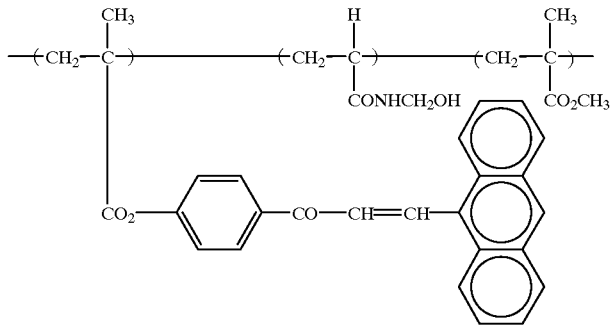
A-8
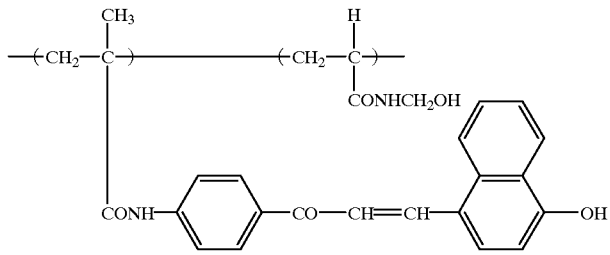
A-9

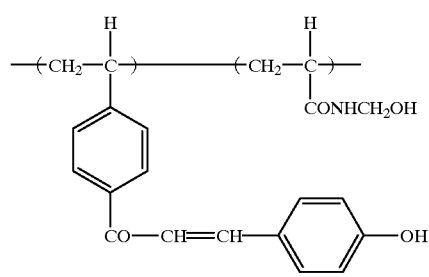
A-10
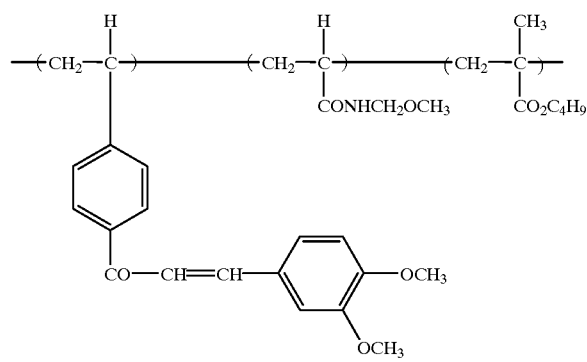
A-11
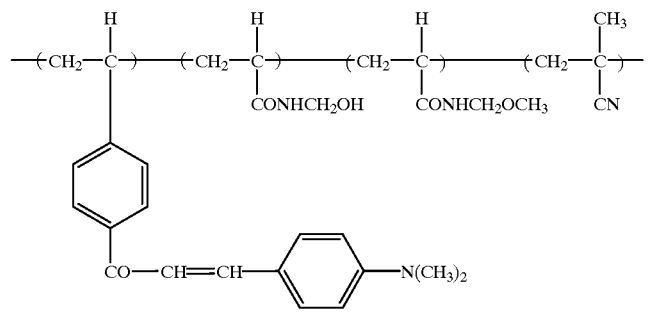
A-12
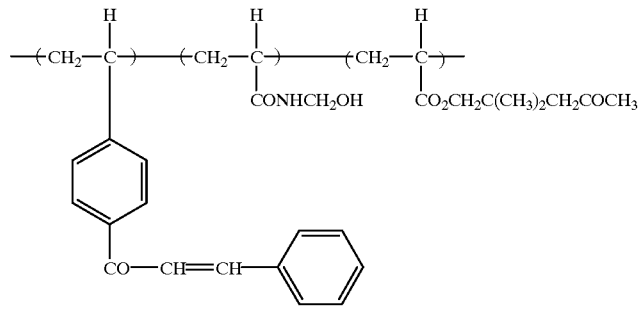
A-13

-continued
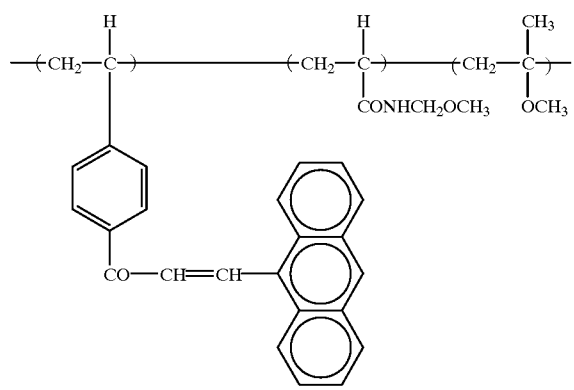
A-14
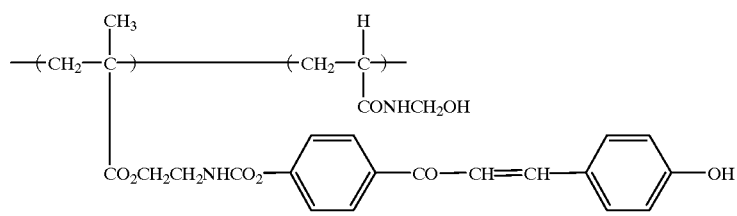
A-15
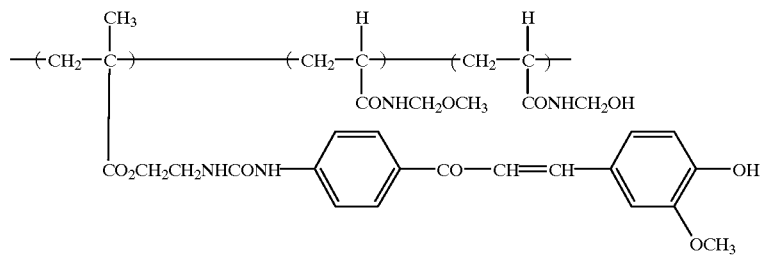
A-16
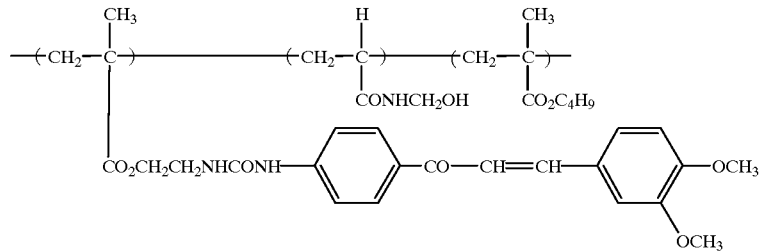
A-17
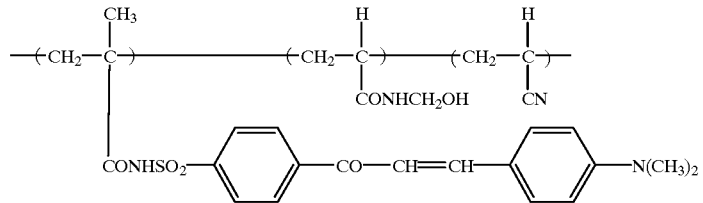
A-18

-continued
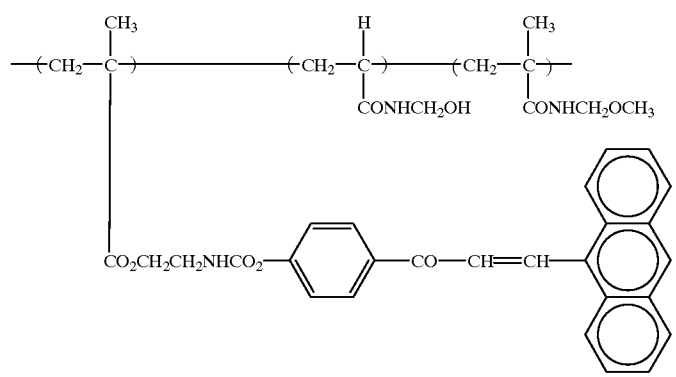
A-19
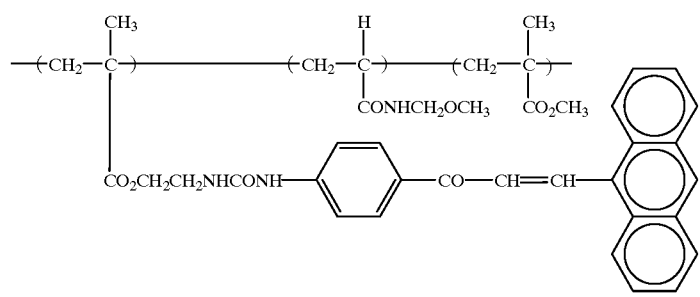
A-20
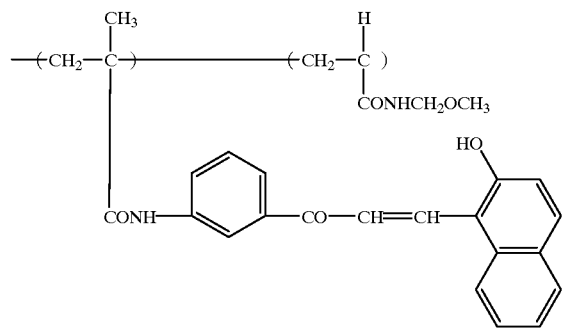
A-21
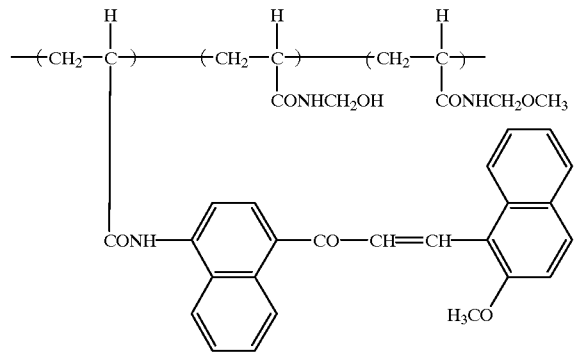
A-22
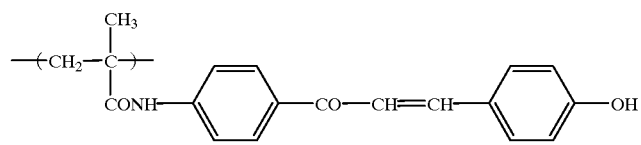
B-1

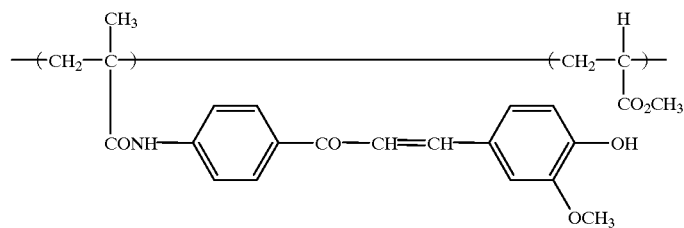
B-2
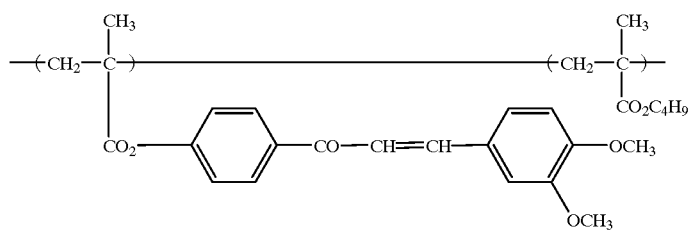
B-3
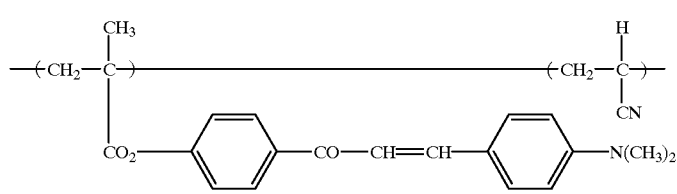
B-4
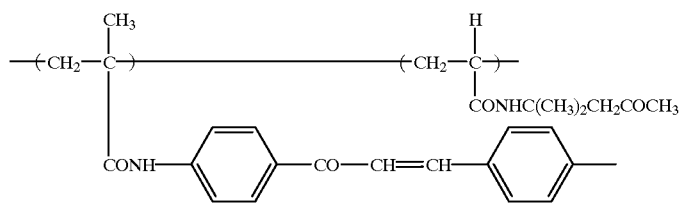
B-5
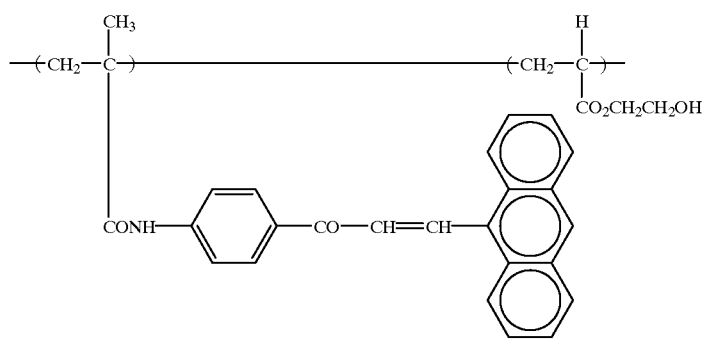
B-6
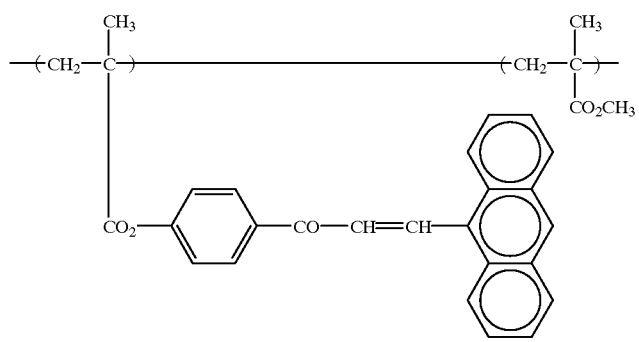
B-7

-continued
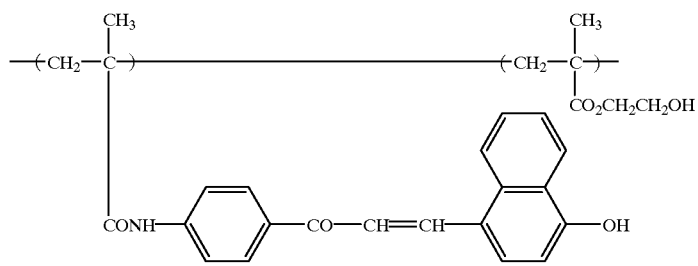
B-8
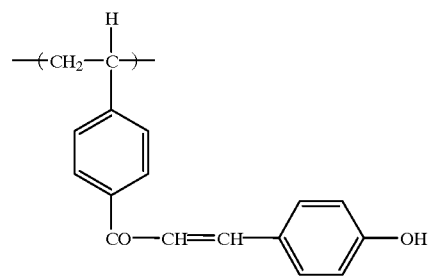
B-9
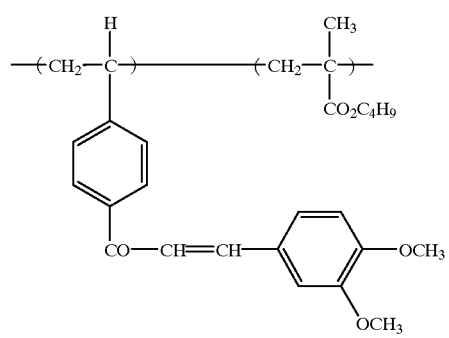
B-10
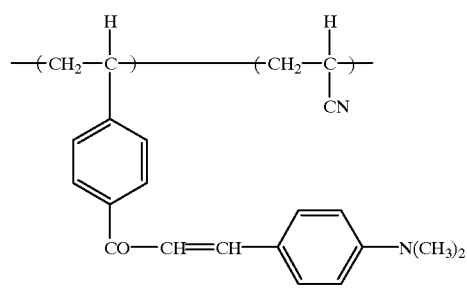
B-11
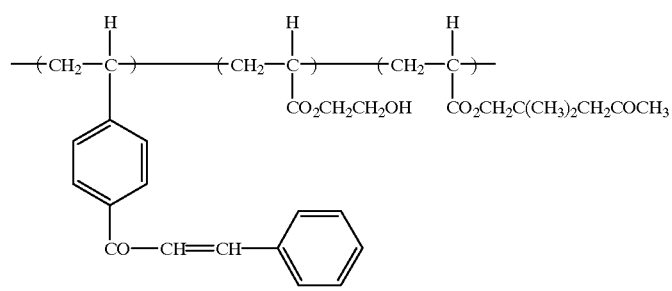
B-12

-continued
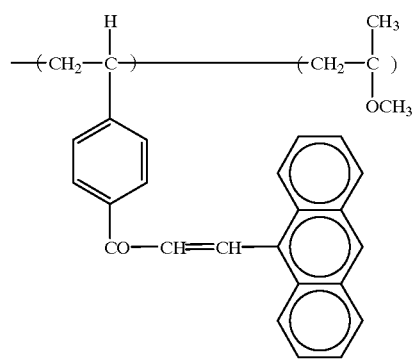
B-13
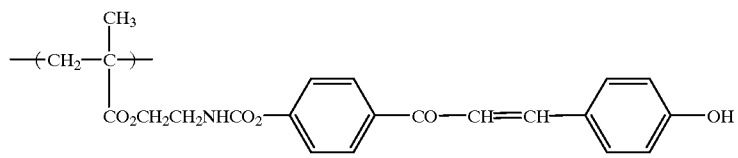
B-14
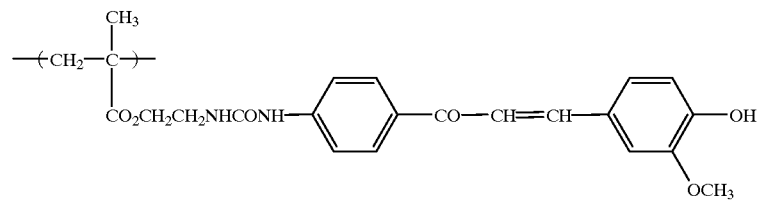
B-15
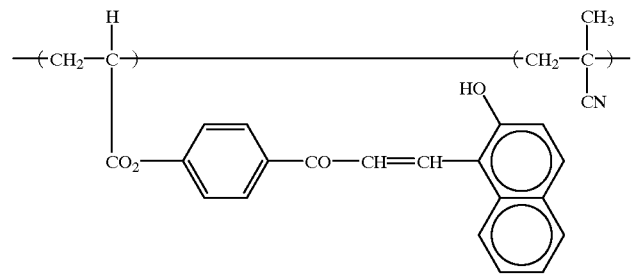
B-16
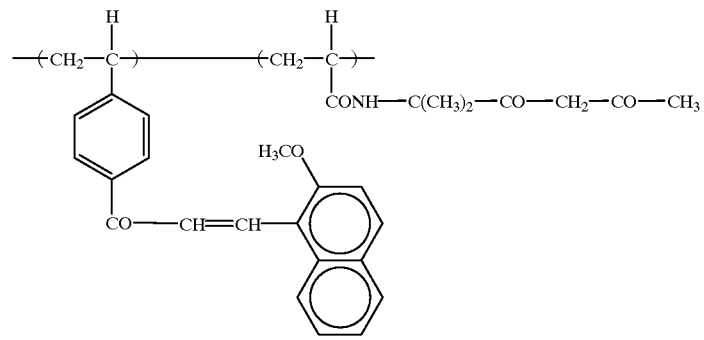
B-17

-continued

B-18
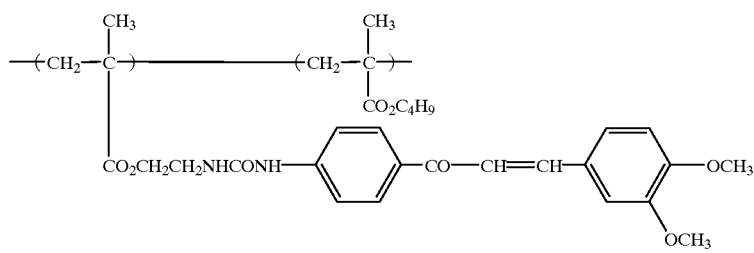

B-19
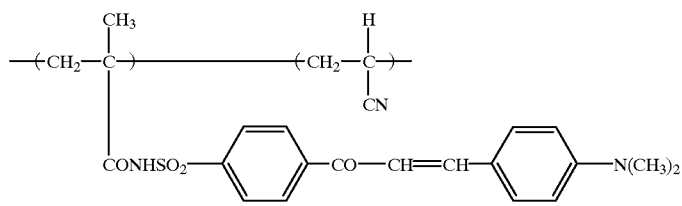

B-20
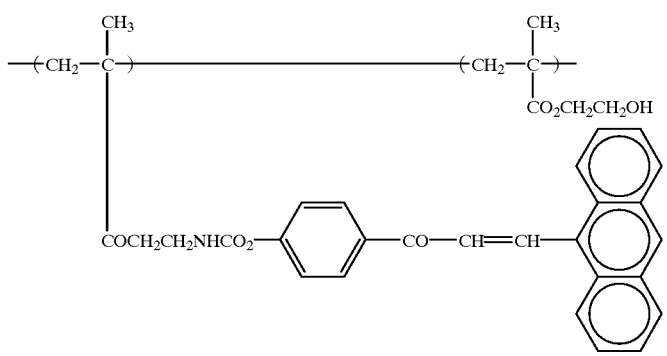

B-21
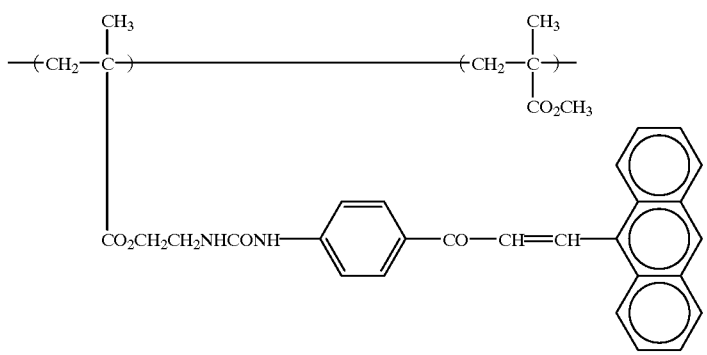

The polymer compound of the present invention has a light absorbing group as a crosslinking reaction site. In particular, a polymer compound having an electron donative substituent introduced into Y shows a high reactivity with a heat crosslinking agent. Thus, the amount of additives required to provide a heat crosslinking effect or heat-crosslinkable copolymers to be incorporated in such a polymer compound can be minimized. Accordingly, a higher absorbance can be realized for anti-reflective coating.

The polymer compound of the present invention may be any of random copolymer, block copolymer and graft copolymer.

The polymer compound of the present invention can be synthesized by radical polymerization, anionic polymerization, cationic polymerization or the like. These polymerization methods may be in various forms such as solution polymerization, suspension polymerization, emulsion polymerization and bulk polymerization.

The molecular weight of the polymer compound of the present invention depends on the kind of the coating solution used, the required solution viscosity, the required film form, etc. The weight-average molecular weight of the polymer compound is normally from 1,000 to 1,000,000, preferably from 2,000 to 300,000, more preferably from 3,000 to 200,000.

The amount of the polymer compound to be incorporated in the composition for anti-reflective coating material of the present invention is normally from 50 to 100% by weight, preferably from 80 to 98% by weight based on the solid content.

Next, melamine, guanamine or urea compound substituted by at least one group selected from the group consisting of a methylol group and an alkoxymethyl group at two or more positions (as compound (b)) will be further described hereinafter.

The foregoing alkoxy group is preferably a $C_{1-4}$ alkoxy group, more preferably methoxy or ethoxy.

The number of the at least one group selected from the group consisting of a methylol group and an alkoxymethyl group to be contained in the foregoing compound is preferably from 2 to 6, more preferably from 5 to 6, if the compound is melamine, or preferably from 2 to 4, more preferably from 3 to 4, if the compound is guanamine or urea.

The foregoing methylol group-containing compound can be obtained by the reaction of melamine, guanamine or urea with formalin in the presence of a basic catalyst such as sodium hydroxide, potassium hydroxide, ammonia and tetraalkyl ammonium hydroxide. The alkoxymethyl group-containing compound can be obtained by heating the foregoing methylol group-containing compound in the presence of an acid catalyst such as hydrochloric acid, sulfuric acid, nitric acid and methanesulfonic acid in an alcohol.

Examples of the compound (b) include compounds obtained by methoxymethylating 1 to 5 methylol groups in hexamethylol melamine, hexamethoxymethyl melamine and hexamethylol melamine, mixture thereof, compounds obtained by methoxymethylating 1 to 3 methylol groups in hexamethoxyethyl melamine, tetramethylol guanamine, tetramethoxymethyl guanamine and tetramethylol guanamine, mixture thereof, compounds obtained by methoxymethylating 1 to 3 methylol groups in tetramethoxyethyl guanamine, tetramethylol urea, tetramethoxymethyl urea and tetramethylol urea, mixture thereof, tetramethoxyethyl urea, homopolymer or copolymer of N-methylolacrylamide, and homopolymer or copolymer obtained by methoxymethylating some methylol groups in the homopolymer or copolymer of N-methylolacrylamide.

The content of the compound (b) in the composition of the present invention is preferably from 2 to 50% by weight, more preferably from 5 to 30% by weight based on the solid content.

Next, phenol, naphthol or hydroxyanthracene compound substituted by at least one group selected from the group consisting of a methylol group and an alkoxymethyl group at two or more positions (as compound (c)) will be further described hereinafter.

The foregoing methylol or alkoxymethyl group has the same meaning as defined above.

The phenol compound as a skeleton is a phenol compound which is unsubstituted at 2- or 4-position in the phenolic OH group. Examples of such a phenol compound include phenol, o-cresol, m-cresol, p-cresol, 2,3-xylenol, 2,5-xylenol, 3,4-xylenol, 3,5-xylenol, bisphenols such as bisphenol A, 4',4-bishydroxybiphenyl, and TrisP-PA (available from Honshu Chemical Industry Co., Ltd.).

Referring to the content of at least one group selected from the group consisting of a methylol group and an alkoxymethyl group in the phenol compound, at least two methylol or alkoxymethyl groups are required per one molecule of the phenol compound. From the standpoint of heat crosslinkability and preservability, a phenol compound substituted all at 2- and 4-positions in the phenolic OH group is desirable.

Preferred among these phenol compounds are trimethylol phenol, bishydroxymethyl-p-cresol, tetramethylol bisphenol A, hexamethylol of TrisP-PA (available from Honshu Chemical Industry Co., Ltd.), and phenol compound obtained by substituting methylol groups in these compounds by alkoxymethyl group or both methylol group and alkoxymethyl group.

The naphthol or hydroxyanthracene compound as a skeleton is unsubstituted at 2-position in OH group. Examples of such a naphthol or hydroxyanthracene compound include 1-naphthol, 2-naphthol, 1-hydroxyanthracene, and 2-hydroxyanthracene.

The phenol compound as a skeleton may be substituted or unsubstituted at 3- or 5-position. The naphthol compound as a skeleton, too, may be substituted or unsubstituted at positions other than 2-position in OH group.

As the phenol compound (c) the compound represented by the general formula (III) is more desirable. The use of this compound further enhances the absorbance of the composition for anti-reflective coating material. The resulting anti-coating material is particularly useful.

In the general formula (III), Y is as defined in the general formula (I) and is preferably —OH, —OCH$_3$, —N(R$^7$)(R$^8$) or —SCH$_3$ (in which R$^7$ and R$^8$ may be the same or different and each represent a hydrogen atom or a $C_{1-20}$ hydrocarbon group). P represents a $C_{6-14}$ trivalent or tetravalent aromatic ring, preferably trivalent or tetravalent phenylene, naphthylene or anthrylene group.

The methylol group-containing compound can be obtained by the reaction of a phenol compound having a hydrogen atom at 2- or 4-position in the phenolic OH group as a starting material with formalin in the presence of a basic catalyst such as sodium hydroxide, potassium hydroxide, ammonia and tetraalkylammonium hydroxide. The alkoxymethyl group-containing compound can be obtained by heating the foregoing methylol group-containing compound in the presence of an acid catalyst such as hydrochloric acid, sulfuric acid, nitric acid and methanesulfonic acid in an alcohol.

Examples of the compound (c) include compounds obtained by methoxymethylating 1 to 2 methylol groups in trimethylol phenol, tri(methoxymethyl)phenol and trimethylol phenol, compounds obtained by methoxymethylating 1 to 2 methylol groups in trimethylol-3-cresol, tri(methoxymethyl)-3-cresol and trimethylol-3-cresol, dimethylol cresol such as 2,6-dimethylol-4-cresol, compounds obtained by methoxymethylating 1 to 3 methylol groups in tetramethylol bisphenol A, tetramethoxymethyl bisphenol A and tetramethylol bisphenol A, tetramethylol-4,4'-bishydroxybiphenyl, tetramethoxymethyl-4,4'-bishydroxybiphenyl, hexamethylol form of TrisP-PA, hexamethoxymethyl form of TrisP-PA, and compounds obtained by methoxymethylating 1 to 5 methylol groups in hexamethylol form of TrisP-PA.

The content of the compound (c) in the composition of the present invention is preferably from 2 to 50% by weight, more preferably from 5 to 30% by weight based on the solid content.

The composition for anti-reflective coating material of the present invention may comprise further light absorbers, auxiliary adhesives and surface active agents incorporated therein as necessary.

Examples of the light absorbers to be further incorporated include those described in Kogyo-you Shikiso No Gijutsu To Shijo (which means "Technique And Market of Industrial Dyes"), CMC Shuppan, and Senryo Binran (which means "Handbook of Dyes"), The Society of Synthetic Organic Chemistry, Japan, e.g., C.I. Disperse Yellow 1, 3, 4, 5, 7, 8, 13, 23, 31, 49, 50, 51, 54, 60, 64, 66, 68, 79, 82, 88, 90, 93, 102, 114 and 124, C.I. Disperse Orange 1, 5, 13, 25, 29, 30, 31, 44, 57, 72, and 73, C.I. Disperse Red 1, 5, 7, 13, 17, 19, 43, 50, 54, 58, 65, 72, 73, 88, 117, 137, 143, 199 and 210, C.I. Disperse Violet 43, C.I. Disperse Blue 96, C.I. Fluorescent Brightening Agent 112, 135 and 163, C.I. Solvent Orange 2 and 45, C.I. Solvent Red 1, 3, 8, 23, 24, 25, 27 and 49, C.I. Pigment Green 10, C.I. Pigment Brown 2. The light absorber is normally incorporated in an amount of not more than 50 parts by weight, preferably not more than 30 parts by weight based on 100 parts by weight of the composition for anti-reflective coating material.

The auxiliary adhesive is incorporated mainly for the purpose of enhancing the adhesivity of the composition for anti-reflective coating material to the substrate or resist, particularly preventing the resist from being peeled off at the etching step. Specific examples of the auxiliary adhesive-include chlorosilanes such as trimethyl chlorosilane, dimethylvinyl chlorosilane, methyldiphenyl chlorosilane and chloromethyldimethyl chlorosilane, alkoxysilanes such as trimethyl methoxysilane, dimethyl diethoxysilane, methyl dimethoxysilane, dimethylvinyl ethoxysilane, diphenyl dimethoxysilane and phenyl triethoxysilane, silazanes such as hexamethyl disilazane, N,N'-bis(trimethylsilyl)urea, dimethyl trimethylsilylamine and trimethylsilyl imidazole, silanes such as vinyl trichlorosilane, γ-chloropropyl trimethoxysilane, γ-aminopropyl triethoxysilane and γ-glycidoxypropyl trimethoxysilane, heterocyclic compounds such as benzotriazole, benzoimidazole, indazole, imidazole, 2-mercaptobenzimidazole, 2-mercaptobenzthiazole, 2-mercaptobenzoxazole, urazole thiouracil, mercaptoimidazole and mercaptopyrimidine, ureas such as 1,1-dimethylurea and 1,3-dimethylurea, and thiourea compounds.

The foregoing auxiliary adhesive is normally incorporated in an amount of less than 10 parts by weight, preferably less than 5 parts by weight based on 100 parts by weight of the composition for anti-reflective coating material.

The composition for anti-reflective coating material of the present invention may comprise a surface active agent incorporated therein to further enhance coating properties such as striation.

Examples of the surface active agent employable herein include nonionic surface active agents such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkyl allyl ethers (e.g., polyoxyethylene octyl phenol ether, polyoxyethylene nonyl phenol ether), polyoxyethylene-polyoxypropylene block copolymers, sorbitan aliphatic acid esters (e.g., sorbitan monolaurate, sorbitan monopalmitate, sorbitan monostearate, sorbitan monooleate, sorbitan trioleate, sorbitan tristearate) and polyoxyethylene sorbitanaliphatic acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate), fluorine surface active agents such as EFTOP EF301, EF303, EF352 (available from Tohkem Products Corp. (formerly Shinakita Kasei K.K.)), Megafac F171, F173 (available from Dainippon Ink & Chemicals, Inc.), Florad FC430, FC431 (available from Sumitomo 3M Co., Ltd.), and Asahi Guard AG710, Surflon S-382, SC101, SC102, SC103, SC104, SC105, SC106 (available from Asahi Glass Co., Ltd.), organosiloxane polymer KP341 (available from Shin-etsu Chemical Co., Ltd.), and acrylic acid or methacrylic acid (co)polymer polyflow No. 75 and No. 95 (available from Kyoeisha Yushi Kogyo K.K.). Particularly preferred among these surface active agents are fluorine surface active agents and silicone surface active agents. The amount of such a surface active agent to be incorporated is normally not more than 2 parts by weight, preferably not more than 1 part by weight based on 100 parts by weight of the solid content in the composition of the present invention.

These surface active agents may be added singly or in combination.

Examples of the solvent for dissolving the anti-reflective coating composition therein include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, methyl 3-ethoxypropionate, methyl pyruvate, ethyl pyruvate, ethyl acetate, and butyl acetate. These organic solvents may be used singly or in combination.

Further, high boiling solvents such as N-methylformamide, N,N-dimethylformamide, N-methylacetamide, N,N-dimethylacetamide, N-methylpyrrolidone, dimethylsulfoxide and benzyl ethyl ether may be used in admixture.

Preferred among these solvents are cyclopentanone, cyclohexanone, methyl 3-methoxypropionate and ethyl 3-ethoxypropionate, which can further prevent the intermixing of resist.

The solid content in the composition for anti-reflective coating material of the present invention is preferably from 50 to 98% by weight, more preferably from 70 to 95% by weight.

In the present invention, as the resist to be applied to the anti-reflective coating there may be used either a negative-working or positive-working resist.

Specific examples of the resist employable herein include positive-working resist made of a novolak resin and 1,2-naphthoquinonediazidesulfonic acid ester, chemically-amplified resist made of a photoacid generator and a binder having a group which decomposes by the action of an acid to raise the alkali dissolving rate of the resist, chemically-amplified resist made of an alkali-soluble binder, a photo-acid generator and a low molecular compound which decomposes by the action of an acid to raise the alkali dissolving rate of the resist, and chemically-amplified resist made of a photoacid generator, a binder which decomposes by the action of an acid to raise the alkali dissolving rate, and a low molecular compound which decomposes by the action of an acid to raise the alkali dissolving rate of the resist. Further preferred examples of the resist include FHi-620BC and ARCH-2 available from Fuji Hunt Electronics Technology Co., Ltd.

The foregoing anti-reflective coating composition is applied to a substrate commonly used in the production of precision integrated circuit elements (e.g., transparent substrate such as silicon/silicon dioxide-coated glass substrate, ITO substrate) by a proper coating means such as spinner and coater, and then baked so that it is cured to prepare an anti-reflective coating. The thickness of the anti-reflective coating is preferably from 0.01 to 3.0 μm. The baking of the anti-reflective coating composition thus applied is preferably effected at a temperature of from 80° C. to 250° C. for 1 to 120 minutes. Thereafter, a photoresist is applied to the anti-reflective coating. The photoresist film is exposed to light through a predetermined mask, developed, rinsed, and then dried to obtain a good resist. If necessary, the photoresist which has been exposed to light may further be baked as PEB (Post Exposure Bake).

As the developer for the positive-working photoresist composition comprising the anti-reflective coating composition of the present invention there may be used an aqueous solution of an alkali such as inorganic alkali (e.g., sodium hydroxide, potassium hydroxide, sodium carbonate, sodium silicate, sodium metasilicate, aqueous ammonia), primary amine (e.g., ethylamine, n-propylamine), secondary amine (e.g., diethylamine, di-n-butylamine), tertiary amine (e.g., triethylamine, methyldiethylamine), alcoholamine (e.g., dimethylethanolamine, triethanolamine), quaternary ammonium salt (e.g., tetramethylammonium hydroxide, tetraethylammonium hydroxide, choline) and cyclic amine (e.g., pyrrole, piperidine). The foregoing aqueous solution of an alkali may further comprise alcohols such as isopropyl alcohol and surface active agents such as nonionic surface active agent incorporated therein in a proper amount before use.

Preferred among these developers are quaternary ammonium salts, more preferably tetramethylammonium hydroxide and choline.

The present invention will be further described in the following examples, but the present invention should not be construed as being limited thereto.

SYNTHESIS EXAMPLE 1

Synthesis of (4-acetylphenyl) methacrylamide

Into a four-necked flask equipped with an agitator, a reflux condenser, a thermometer and a dropping apparatus were charged 135 g of (4-amino)acetophenone, 101 g of triethylamine, 500 ml of acetone and 0.5 g of methoxyphenol. To the reaction mixture was then added dropwise 105 g of methacryloyl chloride at a temperature of 10° C. in 2 hours. To the reaction solution was then added 1 l of distilled water. The resulting crystal was recovered by filtration. (Yield: 78%)

SYNTHESIS EXAMPLE 2

The crystal thus obtained in Synthesis Example 1 was then dried. 204 g of the crystal thus dried was then dissolved in 500 ml of methanol. To the solution were then added 122 g of 4-hydroxybenzaldehyde and 10 g of methanesulfonic acid. The reaction mixture was then allowed to undergo reaction at a temperature of 60° C. for 4 hours. To the reaction system was then added 1 l of distilled water. The resulting crude crystal was then recovered by filtration. The crude crystal was then recrystallized from a mixture of ethanol and water. (Yield: 74%; λmax: 355 nm (methanol))

SYNTHESIS EXAMPLE 3

The crystal thus obtained in Synthesis Example 1 was then dried. 234 g of the crystal thus dried was then dissolved in 500 ml of methanol. To the solution were then added 152 g of 3-methoxy-4-hydroxybenzaldehyde and 10 g of methanesulfonic acid. The reaction mixture was then allowed to undergo reaction at a temperature of 60° C. for 4 hours. To the reaction system was then added 1 l of distilled water. The resulting crude crystal was then recovered by filtration. The crude crystal was then recrystallized from a mixture of ethanol and water. (Yield: 83%; λmax: 368 nm (methanol))

SYNTHESIS EXAMPLE 4

The crystal thus obtained in Synthesis Example 1 was then dried. 234 g of the crystal thus dried was then dissolved in 500 ml of methanol. To the solution were then added 166 g of 3,4-dimethoxybenzaldehyde and 10 g of methanesulfonic acid. The reaction mixture was then allowed to undergo reaction at a temperature of 60° C. for 4 hours. To the reaction system was then added 1 l of distilled water. The resulting crude crystal was then recovered by filtration. The crude crystal was then recrystallized from a mixture of ethanol and water. (Yield: 89%; λmax: 350 nm (methanol))

SYNTHESIS EXAMPLE 5

The crystal thus obtained in Synthesis Example 1 was then dried. 234 g of the crystal thus dried was then dissolved in 500 ml of methanol. To the solution were then added 149 g of N,N-dimethylaminobenzaldehyde and 10 g of methanesulfonic acid. The reaction mixture was then allowed to undergo reaction at a temperature of 60° C. for 4 hours. To the reaction system was then added 1 l of distilled water. The resulting crude crystal was then recovered by filtration. The crude crystal was then recrystallized from a mixture of ethanol and water. (Yield: 89%; λmax: 370 nm (methanol))

SYNTHESIS EXAMPLE 6

18 g of the methacryl monomer obtained in Synthesis Example 2 and 2 g of N-methylol acrylamide were dissolved in 60 g of DMF. The reaction solution was heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 8,000 in polystyrene equivalence as a standard.

SYNTHESIS EXAMPLE 7

12 g of the methacryl monomer obtained in Synthesis Example 3, 5 g of methyl methacrylate and 3 g of N-methylol acrylamide were dissolved in 60 g of DMF. The reaction solution was heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 12,000 in polystyrene equivalence as a standard.

SYNTHESIS EXAMPLE 8

12 g of the methacryl monomer obtained in Synthesis Example 4, 5 g of t-butyl methacrylate and 3 g of N-methylol acrylamide were dissolved in 120 g of methanol. The reaction solution was heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all.

To the reaction solution was then added 0.1 g of sulfuric acid. The reaction solution was then stirred at room temperature for 2 hours. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 4,000 in polystyrene equivalence as a standard.

SYNTHESIS EXAMPLE 9

12 g of the methacryl monomer obtained in Synthesis Example 5, 5 g of acrylonitrile and 3 g of diacetone acrylamide were dissolved in 120 g of methanol. The reaction solution was heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all. To the reaction solution were then added 4 g of an aqueous solution of formalin and 4 g of tetrametylammonium hydroxide. The reaction solution was then stirred for 4 hours.

COMPARATIVE SYNTHESIS EXAMPLE 1

18 g of the methacryl monomer obtained in Synthesis Example 2, 4.5 g of methacrylic acid and 9 g of glycidyl methacrylate were dissolved in 60 g of DMF. The reaction solution was heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 9,000 in polystyrene equivalence as a standard.

EXAMPLES 1 TO 4 AND COMPARATIVE EXAMPLE 1

The polymers obtained in Synthesis Examples 6 to 9 were each dissolved in ethyl 3-ethoxypropionate in an amount of 10 g to make a 10% solution. The solutions were each filtered through a microfilter made of teflon having a pore diameter of 0.10 $\mu$m to prepare an anti-reflective coating solution. The anti-reflective coating solutions thus prepared were each applied to a silicon wafer by means of a spinner. The coated materials thus obtained were each heated to a temperature of 170° C. over a vacuum-contact hot plate for 3 minutes to form an anti-reflective coating. The polymer of Comparative Synthesis Example 1 was similarly processed to form an anti-reflective coating.

The thickness of the foregoing anti-reflective coatings were all 0.17 $\mu$m.

These anti-reflective coatings were each then dipped in a solvent for resist such as γ-butyrolactone and ethoxyethyl propionate to confirm that they were insoluble therein.

To the anti-reflective coatings thus obtained was each applied FHi-620BC (available from Fuji Hunt Electronics Technology Co., Ltd.) as a positive-working photoresist to a thickness of 0.85 $\mu$m. The photoresist films thus formed were each exposed to light from a reduction projection exposing machine (NSR-2005i9C, available from Nikon Corp.), developed with a 2.38% aqueous solution of tetramethylammonium hydroxide for 1 minute, and then dried for 30 seconds. The resist patterns thus formed on the silicon wafer were each examined for limited resolving power and dependence on film thickness under a scanning electron microscope. The resist films were each also measured for absorbance at 365 nm.

For the measurement of absorbance at 365 nm, the anti-reflective coating composition solution was applied to a quartz plate, and then dried to form a film to be measured. A spectrophotometer UV-240 available from Shimadzu Corp. was used.

The limited resolving power is determined at the exposure which reproduces a 0.50 $\mu$m mask pattern at a film thickness of 0.85 $\mu$m.

For the evaluation of dependence on film thickness, the ratio of sensitivity at a resist film thickness of 0.85 $\mu$m to sensitivity at a resist film thickness of 0.87 $\mu$m was determined. The nearer to 1.0 this value is, the better is the independence of sensitivity from film thickness.

For the measurement of dry etching rate, CSE-1110 available from ULVAC Japan, Ltd. was used. The rate of reduction of film thickness in the presence of $CF_4/O_2$ was determined.

The results of evaluation are set forth in Table 1.

TABLE 1

|  | Absorbance of film at 365 nm (/$\mu$m) | Limited resolving power ($\mu$m) | Dependence on film thickness | Dry etching rate (Å/min.) |
| --- | --- | --- | --- | --- |
| Example 1 | 5.694 | 0.28 | 0.98 | 612 |
| Example 2 | 5.243 | 0.29 | 0.98 | 638 |
| Example 3 | 5.012 | 0.28 | 0.98 | 672 |
| Example 4 | 4.873 | 0.29 | 0.98 | 619 |
| Comparative Example 1 | 3.984 | 0.31 | 0.97 | 643 |

These results show that the composition for anti-reflective coating material of the present invention exhibits a high absorbance in the form of film, enhances the limited resolving power of a photoresist film under which it is provided and shows a drop in the dependence of sensitivity on film thickness caused by stationary wave due to reduction of light reflected by the substrate.

SYNTHESIS EXAMPLE 10

The crystal obtained in Synthesis Example 1 was dried. 204 g of the crystal thus dried was then dissolved in 500 ml of methanol. To the solution were then added 206 g of 9-anthraaldehyde and 10 g of methanesulfonic acid. The reaction solution was then allowed to undergo reaction at a temperature of 60° C. for 4 hours. To the reaction solution was then added 1 l of distilled water. The resulting crude crystal was recovered by filtration. The crude crystal thus recovered was then recrystallized from a mixture of ethanol and water. (Yield: 65%)

SYNTHESIS EXAMPLE 11

5 g of the methacryl monomer obtained in Synthesis Example 10, 12 g of methyl methacrylate and 3 g of N-methylol acrylamide were dissolved in 60 g of DMF. The reaction solution was then heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 4,000 in polystyrene equivalence as a standard.

COMPARATIVE SYNTHESIS EXAMPLE 2

18 g of the acryl monomer obtained in Synthesis Example 10, 4.5 g of methacrylic acid and 9 g of glycidyl methacrylate were dissolved in 60 g of DMF. The reaction solution was then heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 9,000 in polystyrene equivalence as a standard.

COMPARATIVE SYNTHESIS EXAMPLE 3

208 g of 9-hydroxymethylanthracene, 101 g of triethylamine and 1 g of hydroquinone were dissolved in 1 l of DMF. To the solution was then added dropwise 90 g of acryloyl chloride in 2 hours in such a manner that the reaction solution temperature didn't exceed 30° C. To the reaction solution was then added 2 l of distilled water. The resulting crude crystal was recovered by filtration. The crude crystal was then recrystallized from a mixture of ethanol and water. (Yield: 75%)

7 g of the acryl monomer thus obtained and 12 g of methyl acrylate were dissolved in 60 g of DMF. The reaction solution was then heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 4,000 in polystyrene equivalence as a standard.

EXAMPLE 5 AND COMPARATIVE EXAMPLES 2 AND 3

The polymer obtained in Synthesis Example 11 was dissolved in ethoxyethyl propionate in an amount of 10 g to make a 10% solution. The solution thus obtained was then filtered through a microfilter made of teflon having a pore diameter of 0.10 $\mu$m to prepare an anti-reflective coating solution. The anti-reflective coating solution thus prepared was then applied to a silicon wafer by means of a spinner. The coated material thus obtained was then heated to a temperature of 170° C. over a vacuum-contact hot plate for 3 minutes to form an anti-reflective coating. The compounds of Comparative Synthesis Examples 2 and 3 were each similarly processed to form an anti-reflective coating. These anti-reflective coatings each had a thickness of 0.17 $\mu$m. The anti-reflective coating composition of Comparative Synthesis Example 3 comprised 3 g of hexamethoxymethyl melamine incorporated therein as a crosslinking agent.

These anti-reflective coatings were each dipped in a solvent for resist such as γ-butyrolactone and ethoxyethyl propionate to confirm that they were insoluble therein.

To the anti-reflective coatings thus obtained was each applied ARCH-2 (available from Fuji Hunt Electronics Technology Co., Ltd.) as a positive-working photoresist for KrF excimer laser to a thickness of 0.85 $\mu$m. The photoresist films thus formed were each exposed to light from a reduction projection exposing machine (NSR-1505EX, available from Nikon Corp.), treated at a temperature of 110° C. for 60 seconds, developed with a 2.38% aqueous solution of tetramethylammonium hydroxide for 1 minute, and then dried for 30 seconds. The resist patterns thus formed on the silicon wafer were each examined for limited resolving power and dependence on film thickness under a scanning electron microscope. The resist films were each also measured for absorbance at 248 nm.

For the measurement of absorbance at 248 nm, the anti-reflective coating composition solution was applied to a quartz plate, and then dried to form a film to be measured. A spectrophotometer UV-240 available from Shimadzu Corp. was used.

The limited resolving power is determined at the exposure which reproduces a 0.85 $\mu$m mask pattern.

For the evaluation of dependence on film thickness, the ratio of sensitivity at a resist film thickness of 0.85 $\mu$m to sensitivity at a resist film thickness of 0.87 $\mu$m was determined. The nearer to 1.0 this value is, the better is the independence of sensitivity from film thickness.

For the measurement of dry etching rate, CSE-1110 available from ULVAC Japan, Ltd. was used. The rate of reduction of film thickness in the presence of $CF_4/O_2$ was determined.

The results of evaluation are set forth in Table 2.

TABLE 2

| | Absorbance of film at 248 nm (/$\mu$m) | Limited resolving power ($\mu$m) | Dependence on film thickness | Dry etching rate (Å/min.) |
|---|---|---|---|---|
| Example 5 | 9.812 | 0.27 | 0.98 | 605 |
| Comparative Example 2 | 7.181 | 0.29 | 0.97 | 598 |
| Comparative Example 3 | 7.141 | 0.27 | 0.97 | 512 |

These results show that the composition for anti-reflective coating material of the present invention exhibits a high absorbance in the form of film, enhances the limited resolving power of a photoresist film under which it is provided and shows a drop in the dependence of sensitivity on film thickness caused by stationary wave due to reduction of light reflected by the substrate. It can also be found that Example 5 of the present invention exhibits a higher dry etching rate than Comparative Example 3, which comprises a crosslinking agent incorporated therein.

SYNTHESIS EXAMPLE 12

Bis(4-hydroxy-3,5-dihydroxymethylstyryl) ketone 122 g of 4-hydroxybenzaldehyde and 30 g of acetone were added to 300 ml of methanol. To the mixture was then added 10 g of methanesulfonic acid. The reaction mixture was then stirred at a temperature of 70° C. for 4 hours. To the reaction solution was then added gradually 1,000 ml of distilled water to obtain bis(4-hydroxystyryl)ketone in the form of yellow crystal. 50 g of the yellow crystal was then dissolved in 200 ml of methanol. To the solution was then added 100 ml of a 10% aqueous solution of sodium hydroxide. To the reaction solution was then added dropwise 50 ml of a 37% aqueous solution of formalin in 30 minutes in such a manner that the temperature of the reaction solution didn't exceed 40° C. The reaction solution was stirred for 10 hours, and then neutralized with acetic acid. The resulting yellow powder was then recovered by filtration. The crude crystal was then recrystallized from methanol. (Yield: 54%)

SYNTHESIS EXAMPLE 13

14 g of the methacryl monomer obtained in Synthesis Example 2 and 6 g of methyl methacrylate were dissolved in 60 g of methanol. Nitrogen was then allowed to flow through the reaction solution for 30 minutes. To the reaction solution was then added 50 mg of V-65 (available from Wako Pure Chemical Industries, Ltd.) as a polymerization initiator every 2 hours three times in all while the reaction solution was being kept to 65° C. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 4,000 in polystyrene equivalence as a standard.

SYNTHESIS EXAMPLE 14

20 g of the methacryl monomer obtained in Synthesis Example 3 was dissolved in 60 g of methanol. Nitrogen was then allowed to flow through the reaction solution for 30 minutes. To the reaction solution was then added 50 mg of V-65 (available from Wako Pure Chemical Industries, Ltd.) as a polymerization initiator every 2 hours three times in all while the reaction solution was being kept to 65° C. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 12,000 in polystyrene equivalence as a standard.

COMPARATIVE SYNTHESIS EXAMPLE 4

18 g of the methacryl monomer obtained in Synthesis Example 2, 4.5 g of methacrylic acid and 9 g of glycidyl methacrylate were dissolved in 60 g of DMF. Nitrogen was then allowed to flow through the reaction solution for 30 minutes. To the reaction solution was then added 50 mg of V-65 (available from Wako Pure Chemical Industries, Ltd.) as a polymerization initiator every 2 hours three times in all while the reaction solution was being kept to 65° C. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 9,000 in polystyrene equivalence as a standard.

EXAMPLES 6 AND 7

18 g of each of the polymer compounds obtained in Synthesis Examples 13 and 14 and 2 g of hexamethoxymethylol melamine were dissolved in ethoxyethyl propionate to make a 10% solution. The solutions were each filtered through a microfilter made of teflon having a pore diameter of 0.10 $\mu$m to prepare an anti-reflective coating solution. The anti-reflective coating solutions thus prepared were each applied to a silicon wafer by means of a spinner. The coated materials thus obtained were each heated to a temperature of 170° C. over a vacuum-contact hot plate for 3 minutes to form an anti-reflective coating (thickness: 0.17 $\mu$m). These anti-reflective coatings were each then dipped in a solvent for resist such as γ-butyrolactone and ethoxyethyl propionate to confirm that they were insoluble therein.

EXAMPLES 8 AND 9

Anti-reflective coating solutions of Examples 8 and 9 were prepared in the same manner as in Examples 6 and 7 except that 2.0 g of tetramethylol bisphenol A was used instead of hexamethoxymethylol melamine. The anti-reflective coating solutions thus prepared were each applied to a silicon wafer by means of a spinner. The coated materials thus obtained were each heated to a temperature of 170° C. over a vacuum-contact hot plate for 3 minutes to form an anti-reflective coating (thickness: 0.17 $\mu$m). These anti-reflective coatings were each then dipped in a solvent for resist such as γ-butyrolactone and ethoxyethyl propionate to confirm that they were insoluble therein.

EXAMPLES 10 AND 11

Anti-reflective coating solutions of Examples 10 and 11 were prepared in the same manner as in Examples 6 and 7 except that 2.0 g of bis(4-hydroxy-3,5-dihydroxymethylstyryl) ketone was used instead of hexamethoxymethylol melamine. The anti-reflective coating solutions thus prepared were each applied to a silicon wafer by means of a spinner. The coated materials thus obtained were each heated to a temperature of 170° C. over a vacuum-contact hot plate for 3 minutes to form an anti-reflective coating (thickness: 0.17 $\mu$m).

These anti-reflective coatings were each then dipped in a solvent for resist such as γ-butyrolactone and ethoxyethyl propionate to confirm that they were insoluble therein.

COMPARATIVE EXAMPLE 4

An anti-reflective coating solution was prepared in the same manner as in Examples 6 and 7 except that 10 g of the polymer obtained in Comparative Synthesis Example 4 was used instead of 18 g of the polymer compound. The anti-reflective coating solution thus prepared was then processed in the same manner as in Examples 6 and 7 to form an anti-reflective coating (thickness: 0.17 $\mu$m).

The anti-reflective coating was then dipped in a solvent for resist such as γ-butyrolactone and ethoxyethyl propionate to confirm that it was insoluble therein.

To the anti-reflective coatings thus obtained was each applied FHi-630BC (available from Fuji Hunt Electronics Technology Co., Ltd.) as a positive-working photoresist to a thickness of 0.85 $\mu$m. The photoresist films thus formed were each exposed to light from a reduction projection exposing machine (NSR-2005i9C, available from Nikon Corp.), developed with a 2.38% aqueous solution of tetramethylammonium hydroxide for 1 minute, and then dried for 30 seconds. The resist patterns thus formed on the silicon wafer were each examined for absorbance at 365 nm, limited resolving power and dependence on film thickness under a scanning electron microscope.

For the measurement of absorbance at 365 nm, the anti-reflective coating composition solution was applied to a quartz plate, and then dried to form a film to be measured.

A spectrophotometer UV-240 available from Shimadzu Corp. was used.

The limited resolving power is determined at the exposure which reproduces a 0.50 μm mask pattern at a film thickness of 0.85 μm.

For the evaluation of dependence on film thickness, the ratio of sensitivity at a resist film thickness of 0.85 μm to sensitivity at a resist film thickness of 0.87 μm was determined. The nearer to 1.0 this value is, the better is the independence of sensitivity from film thickness.

For the measurement of dry etching rate, CSE-1110 available from ULVAC Japan, Ltd. was used. The rate of reduction of film thickness in the presence of $CF_4/O_2$ was determined.

The results of evaluation are set forth in Table 3.

TABLE 3

| | Absorbance of film at 365 nm (/μm) | Limited resolving power (μm) | Dependence on film thickness | Dry etching rate (Å/min.) |
|---|---|---|---|---|
| Example 6 | 7.334 | 0.28 | 0.98 | 617 |
| Example 7 | 5.943 | 0.29 | 0.98 | 633 |
| Example 8 | 7.126 | 0.28 | 0.98 | 681 |
| Example 9 | 5.866 | 0.29 | 0.98 | 598 |
| Example 10 | 7.732 | 0.28 | 0.98 | 591 |
| Example 11 | 6.173 | 0.28 | 0.98 | 634 |
| Comparative Example 4 | 3.984 | 0.31 | 0.97 | 641 |

These results show that the composition for anti-reflective coating material of the present invention exhibits a high absorbance in the form of film, enhances the limited resolving power of a photoresist film under which it is provided and shows a drop in the-dependence of sensitivity on film thickness caused by stationary wave due to reduction of light reflected by the substrate.

SYNTHESIS EXAMPLE 15

The crystal obtained in Synthesis Example 1 was dried. 204 g of the crystal thus dried was then dissolved in 500 ml of methanol. To the solution were then added 206 g of 9-anthraaldehyde and 10 g of methanesulfonic acid. The reaction solution was then allowed to undergo reaction at a temperature of 60° C. for 4 hours. To the reaction solution was then added 1 l of distilled water. The resulting crude crystal was recovered by filtration. The crude crystal thus recovered was then recrystallized from a mixture of ethanol and water. (Yield: 65%)

SYNTHESIS EXAMPLE 16

3 g of the methacryl monomer obtained in Synthesis Example 15 and 17 g of methyl methacrylate were dissolved in 40 g of DMF. The reaction solution was then heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 4,000 in polystyrene equivalence as a standard.

COMPARATIVE SYNTHESIS EXAMPLE 5

6 g of the methacryl monomer obtained in Synthesis Example 15, 3 g of methacrylic acid, 6 g of glycidyl methacrylate and 5 g of methyl methacrylate were dissolved in 60 g of DMF. The reaction solution was then heated to a temperature of 65° C. with nitrogen being allowed to flow therethrough for 30 minutes. To the reaction solution was then added 50 mg of V-65 (available from Wako Pure Chemical Industries, Ltd.) as a polymerization initiator every 2 hours three times in all. The reaction solution was then subjected to reprecipitation in 1 l of distilled water. The reaction product thus precipitated was then recovered in the form of powder. The polymer thus obtained was subjected to GPC analysis. As a result, the polymer was found to have a weight-average molecular weight of 4,000 in polystyrene equivalence as a standard.

EXAMPLE 12

10 g of the polymer obtained in Synthesis Example 16 and 1.6 g of hexamethoxymethyl melamine as a crosslinking agent were dissolved in ethoxyethyl propionate to make a 10% solution. The solution thus obtained was then filtered through a microfilter made of teflon having a pore diameter of 0.10 μm to prepare an anti-reflective coating solution. The anti-reflective coating solution thus prepared was then applied to a silicon wafer by means of a spinner. The coated material thus obtained was then heated to a temperature of 170° C. over a vacuum-contact hot plate for 3 minutes to form an anti-reflective coating (thickness: 0.17 μm).

EXAMPLE 13

An anti-reflective coating (thickness: 0.17 μm) was formed in the same manner as in Example 12 except that 1.6 g of tetramethylol bisphenol A was used instead of hexamethoxymethyl melamine as a heat crosslinking agent.

EXAMPLE 14

An anti-reflective coating (thickness: 0.17 μm) was formed in the same manner as in Example 12 except that 1.6 g of a compound obtained by hexamethoxymethylating TrisP-PA (available from Honshu Chemical Industry Co., Ltd.) was used instead of hexamethoxymethyl melamine as a heat crosslinking agent.

COMPARATIVE EXAMPLE 5

An anti-reflective coating (thickness: 0.17 μm) was formed in the same manner as in Example 12 except that 10 g of the polymer obtained in Comparative Synthesis Example 5 was used instead of the polymer obtained in Synthesis Example 16. The anti-reflective coating composition of Comparative Example 5 comprised 3 g of hexamethoxymethyl melamine incorporated therein as a crosslinking agent.

These anti-reflective coatings were each then dipped in a solvent for resist such as γ-butyrolactone and ethoxyethyl propionate to confirm that they were insoluble therein.

To the anti-reflective coatings thus obtained was each applied ARCH—2 (available from Fuji Hunt Electronics Technology Co., Ltd.) as a positive-working photoresist for KrF excimer laser. The coated material was dried (resist layer thickness: 0.85 μm), exposed to light from a reduction projection exposing machine (NSR-1505EX, available from Nikon Corp.), treated at a temperature of 110° C. for 60 seconds, developed with a 2.38% aqueous solution of tetramethylammonium hydroxide for 1 minute, and then dried for 30 seconds. The resist patterns thus formed on the silicon wafer were each examined for limited resolving power and dependence on film thickness under a scanning electron microscope. The resist films were each also measured for absorbance at 248 nm.

For the measurement of absorbance at 248 nm, the anti-reflective coating composition solution was applied to a quartz plate, and then dried to form a film to be measured. A spectrophotometer UV-240 available from Shimadzu Corp. was used.

The limited resolving power is determined at the exposure which reproduces a 0.35 μm mask pattern at a film thickness of 0.85 μm. For the evaluation of dependence on film thickness, the ratio of sensitivity at a resist film thickness of 0.85 μm to sensitivity at a resist film thickness of 0.87 μm was determined. The nearer to 1.0 this value is, the better is the independence of sensitivity from film thickness.

For the measurement of dry etching rate, CSE-1110 available from ULVAC Japan, Ltd. was used. The rate of reduction of film thickness in the presence of $CF_4/O_2$ was determined.

The results of evaluation are set forth in Table 4.

TABLE 4

|  | Absorbance of film at 248 nm (/μm) | Limited resolving power (μm) | Dependence on film thickness | Dry etching rate (Å/min.) |
|---|---|---|---|---|
| Example 12 | 9.121 | 0.28 | 0.98 | 605 |
| Example 13 | 8.819 | 0.27 | 0.98 | 628 |
| Example 14 | 8.688 | 0.27 | 0.98 | 665 |
| Comparative Example 5 | 7.146 | 0.29 | 0.97 | 598 |

These results show that the composition for anti-reflective coating material of the present invention exhibits a high absorbance in the form of film, enhances the limited resolving power of a photoresist film under which it is provided and shows a drop in the dependence of sensitivity on film thickness caused by stationary wave due to reduction of light reflected by the substrate.

The comparison of Example 12 with Examples 13 and 14 in resist pattern profile shows that as the crosslinking agent to be incorporated in the anti-reflective coating for chemically-amplified resist there may be preferably used a methylolated or alkoxylated phenol compound rather than melamine-formaldehyde condensate. The resist pattern profile shows less trailing at the bottom thereof with the methylolated or alkoxylated phenol compound than with the melamine-formaldehyde condensate probably because the anti-reflective coating with the former crosslinking agent catches less acid.

In accordance with the present invention, a composition for anti-reflective coating material which exhibits a high anti-reflective effect, undergoes no intermixing with the resist layer, provides an excellent resist pattern and shows a higher dry etching rate than resist can be provided. A process for the formation of a resist pattern with such a composition for anti-reflective coating material can also be provided.

While the invention has been described in detail and with reference to specific embodiments thereof, it will be apparent to one skilled in the art that various changes and modifications can be made therein without departing from the spirit and scope thereof.

What is claimed is:

1. A composition for anti-reflective coating material, comprising:

(a) a polymer compound B having repeating units represented by the following general formula (I); and (b) a melamine, guanamine or urea compound substituted by at least one group selected from the group consisting of a methylol group and an alkoxymethyl group at two or more positions:

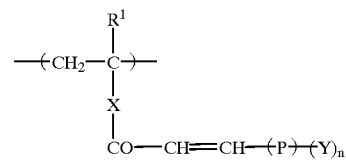

(I)

wherein $R^1$ represents a hydrogen atom, a methyl group, a chlorine atom, a bromine atom or a cyano group; X represents a single bond or a divalent organic connecting group; P represents a $C_{6-14}$ aromatic ring having a valence of (n+1); Y represents an electron donative group; and n represents an integer of from 0 to 3, with the proviso that when n is 2 or 3, the plurality of Y's may be the same or different.

2. The composition for anti-reflecting coating material according to claim 1, wherein in the general formula (I) X represents a single bond or an alkylene group, an arylene group, an aralkylene group, $—CO_2—A$, $—CONH—A—$, $—O—A—$, $CO—A—$, or $—SO_2—A—$ in which A represents a divalent $C_{6-14}$ aromatic ring which may have a substituent, and when X is other than a single bond, the group for X may include at least one divalent group selected from the group consisting of $—CO_2—$, $—COHN—$, $—O—$, $—CO—$ and $—SO_2—$; P represents a phenylene group, a naphthylene group, or an anthrylene group; and Y represents a hydrogen atom, $—OH$, $—OR^4$, $—N(R^5)^6)$ or $—SR^4$.

3. A process for the formation of a resist pattern, which comprises applying a composition for anti-reflective coating material to a substrate, baking the coated substrate so that the anti-reflective coating is cured, and then patternwise forming a photoresist layer thereon, wherein said composition for anti-reflective coating material comprises:

(a) a polymer compound B having repeating units represented by the following general formula (I); and (b) a melamine, guanamine or urea compound substituted by at least one group selected from the group consisting of a methylol group and an alkoxymethyl group at two or more positions:

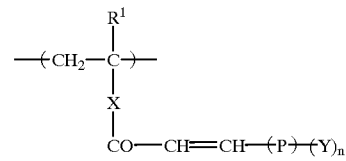

(I)

wherein $R^1$ represents a hydrogen atom, a methyl group, a chlorine atom, a bromine atom or a cyano group; X represents a single bond or a divalent organic connecting group; P represents a $C_{6-14}$ aromatic ring having a valence of (n+1); Y represents an electron donative group; and n represents an integer of from 0 to 3, with the proviso that when n is 2 or 3, the plurality of Y's may be the same or different.

* * * * *